(12) United States Patent
Manukyan et al.

(10) Patent No.: US 10,310,251 B1
(45) Date of Patent: Jun. 4, 2019

(54) SYSTEM AND METHOD FOR ELECTROWETTING DISPLAY DEVICE WITH COLOR FILTERING PIXEL WALLS

(71) Applicant: Amazon Technologies, Inc., Seattle, WA (US)

(72) Inventors: Gor Manukyan, Veldhoven (NL); Tulasi Sridhar Reddy Guntaka, Eindhoven (NL)

(73) Assignee: Amazon Technologies, Inc., Seattle, WA (US)

( * ) Notice: Subject to any disclaimer, the term of this patent is extended or adjusted under 35 U.S.C. 154(b) by 238 days.

(21) Appl. No.: 14/980,840

(22) Filed: Dec. 28, 2015

(51) Int. Cl.
  *G02B 26/00* (2006.01)
  *G02B 5/20* (2006.01)
  *G03F 7/00* (2006.01)

(52) U.S. Cl.
  CPC ........... *G02B 26/005* (2013.01); *G02B 5/201* (2013.01); *G03F 7/0007* (2013.01)

(58) Field of Classification Search
  CPC ..... G03F 7/0007; G02B 26/005; G02B 5/201; G02B 26/0841; G02B 26/001; G02B 26/0833; G02B 26/02; G09G 3/3466
  See application file for complete search history.

(56) References Cited

U.S. PATENT DOCUMENTS

| | | | | |
|---|---|---|---|---|
| 2008/0174846 A1* | 7/2008 | Morozumi | ........... | G02B 26/004 359/228 |
| 2009/0195850 A1* | 8/2009 | Takahashi | ............ | G02B 26/004 359/226.3 |
| 2014/0049157 A1* | 2/2014 | Kim | ........................ | H01J 61/24 313/552 |
| 2014/0092350 A1* | 4/2014 | Byeon | ................... | G02F 1/1339 349/106 |

* cited by examiner

*Primary Examiner* — Joseph P Martinez
*Assistant Examiner* — Vipin Patel
(74) *Attorney, Agent, or Firm* — EIP US LLP

(57) ABSTRACT

A system and method for a display device are presented. The display device includes a first support plate. A wall is over the first support plate. The wall is associated with an electrowetting pixel. The wall is configured to allow for the propagation of light having a wavelength within a first range of wavelengths and prevents propagation of light having a second wavelength in a second range of wavelengths. A color filter is positioned over the electrowetting pixel. The color filter allows propagation of light having the wavelength within the first range of wavelengths and preventing propagation of light having the second wavelength within the second range of wavelengths.

20 Claims, 9 Drawing Sheets

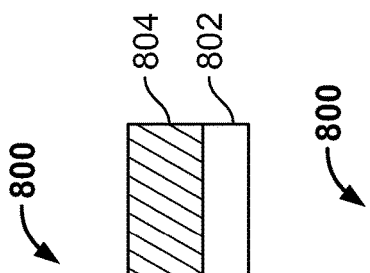
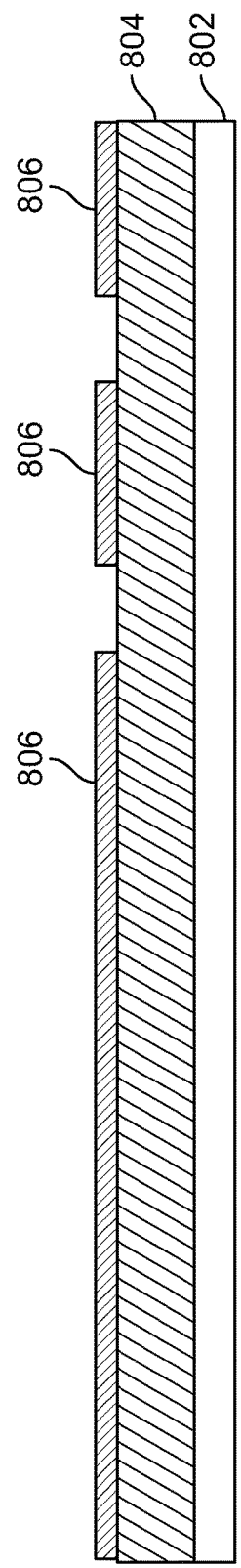
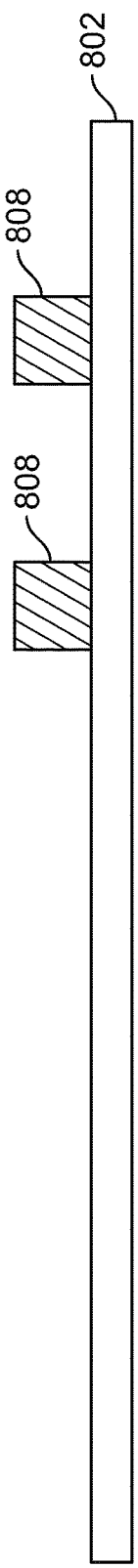
FIG. 8A
FIG. 8B
FIG. 8C

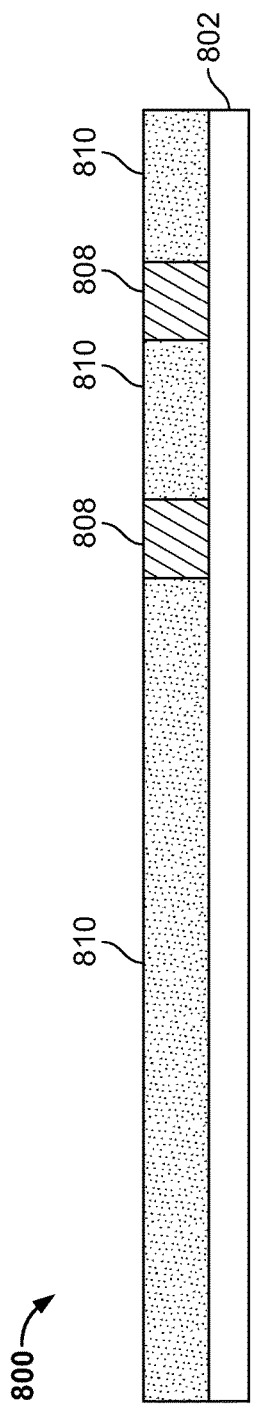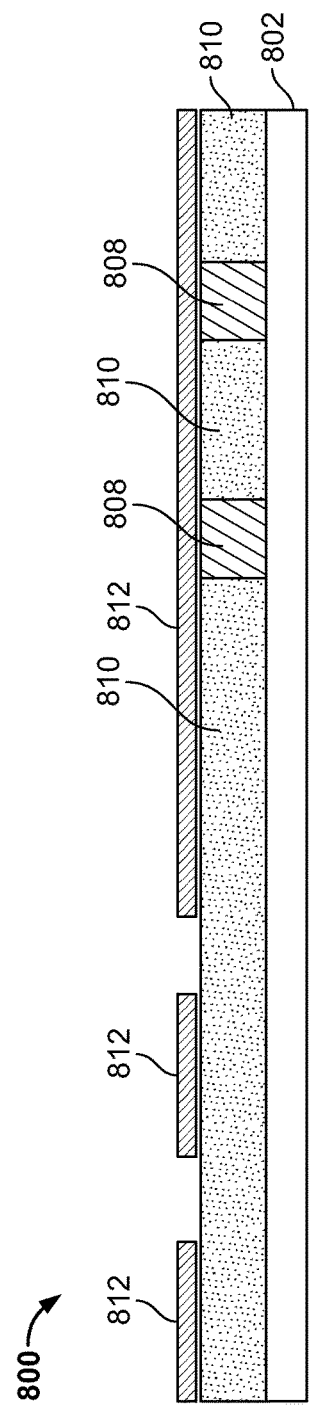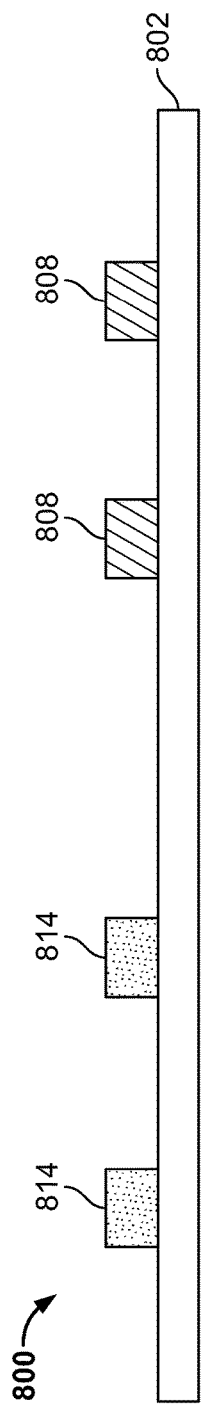

SYSTEM AND METHOD FOR ELECTROWETTING DISPLAY DEVICE WITH COLOR FILTERING PIXEL WALLS

BACKGROUND

Electronic displays are found in numerous types of electronic devices including, without limitation, electronic book ("eBook") readers, mobile phones, laptop computers, desktop computers, televisions, appliances, automotive electronics, and augmented reality devices. Electronic displays may present various types of information, such as user interfaces, device operational status, digital content items, and the like, depending on the kind and purpose of the associated device. The appearance and quality of a display may affect a user's experience with the electronic device and the content presented thereon. Accordingly, enhancing user experience and satisfaction continues to be a priority. Moreover, increased multimedia use imposes high demands on designing, packaging, and fabricating display devices, as content available for mobile use becomes more extensive and device portability continues to be a high priority to the consumer.

An electrowetting display includes an array of pixels individually bordered by pixel walls that retain fluid, such as an opaque oil, for example. Light transmission through each pixel is adjustable by electronically controlling a position of the fluid in the pixel.

BRIEF DESCRIPTION OF THE DRAWINGS

The detailed description is set forth with reference to the accompanying figures. The use of the same reference numbers in different figures indicates similar or identical items or features.

FIGS. 8A-8I illustrate cross-sectional views of an electrowetting display device depicting steps in a photolithography process for forming pixel walls in accordance with the present disclosure.

DETAILED DESCRIPTION

Figure 1A:
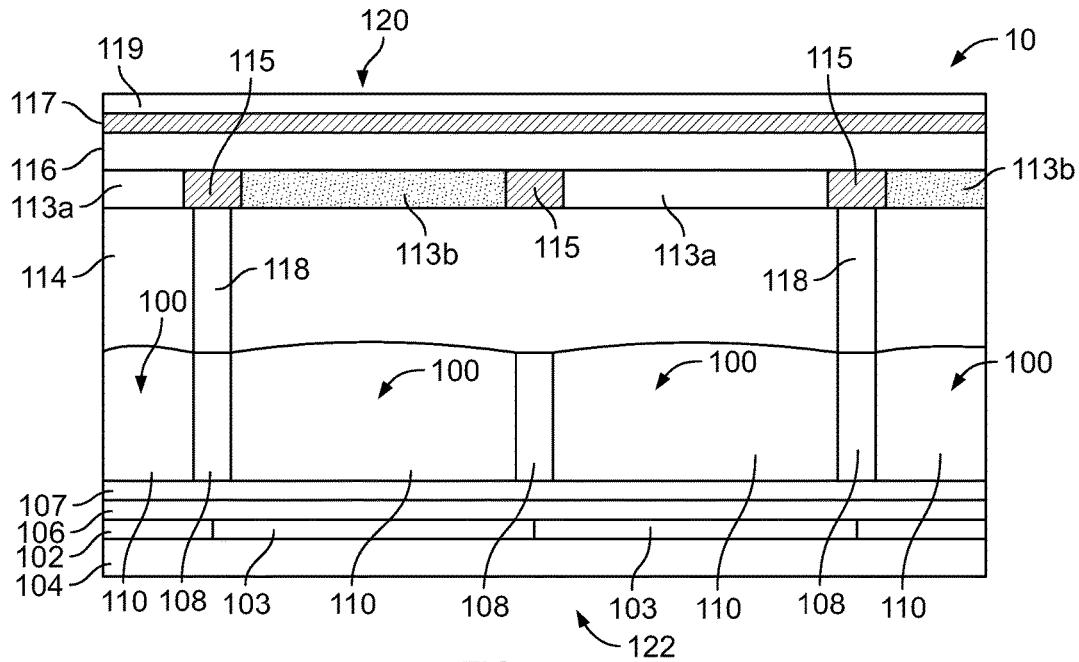
FIGS. 1A and 1B illustrate cross-sectional views of a portion of an electrowetting display device.

In various embodiments described herein, electronic devices include electrowetting displays for presenting content and other information. In some examples, the electronic devices may include one or more components associated with the electrowetting display, such as a touch sensor component layered atop the electrowetting display for detecting touch inputs, a front light or back light component for lighting the electrowetting display, and/or a cover layer component, which may include antiglare properties, antireflective properties, anti-fingerprint properties, anti-cracking properties, and the like.

An electrowetting pixel is surrounded by a number of pixel walls. The pixel walls form a structure that is configured to contain at least a portion of a first fluid, such as a black opaque oil. Light transmission through the electrowetting pixel can be controlled by an application of an electric potential to the electrowetting pixel, which results in a movement of a second fluid, such as an electrolyte solution, within the electrowetting pixel, thereby displacing the first fluid.

When the electrowetting pixel is in a rest state (i.e., with no electric potential applied or at an electric potential that falls below a threshold value causing the electrowetting pixel to be inactive), the opaque oil is distributed throughout the pixel. The oil absorbs light and the pixel in this condition appears black. But when the electric potential is applied, the oil is displaced to one or more sides of the pixel. Light can then enter the pixel striking a reflective surface. The light then reflects out of the pixel, causing the pixel to appear less dark (e.g., white) to an observer. If the reflective surface only reflects a portion of the spectrum of visible light or if color filters are incorporated into the pixel structure, the pixel may appear to have color.

In conventional display device designs, the pixel walls are constructed from a clear material. Consequently light entering one pixel within the display device can sometimes propagate through the pixel walls into other pixels. This phenomenon, referred to herein as cross-talk, can cause a shift in the colors of the image being generated by the display device. For example, cross-talk may cause color shift as pixels of one color reflect light that in fact entered differently-colored pixels of the display device.

Conventional display devices have included black matrix materials formed over the top of or above the pixel walls. The black matrix materials generally include light-absorbing materials and are configured to prevent light that strikes a surface of the display device at an angle nearly normal to that surface entering the display's pixels through one of the pixel walls and reflecting obliquely from a reflective surface back to a viewer, which can lead to cross-talk. But because the black matrix materials block light, such an implementation necessarily reduces the overall brightness of the display device.

In the present system, a pixel wall configuration is described in which the pixels walls are constructed from materials exhibiting color filtering properties. In one embodiment, each pixel in the display device is surrounded by a pixel wall arrangement having pixel walls configured to block electromagnetic radiation having wavelengths other than that reflected by the pixel. As such, electromagnetic radiation from a first pixel of a first wavelength cannot propagate through the pixel wall and enter a second pixel of a second color. Such an implementation, therefore, can reduce cross-talk between pixels of the display device. Additionally, because cross-talk is limited in the present pixel wall design, the black matrix materials of conventional devices can be avoided, thereby allowing more light to enter the display device overall, increasing the display device's brightness. In the present disclosure, the term electromagnetic radiation includes, but is not limited to light and light rays and, specifically, light rays that are at wavelengths within the visible spectrum. As used herein, the term color may refer to a perceived color of visible light or a particular wavelength or ranges of wavelengths of electromagnetic radiation.

A display device, such as an electrowetting display device, may be a transmissive, reflective or transflective display that generally includes an array of pixels configured to be operated by an active matrix addressing scheme. In this disclosure, a pixel may, unless otherwise specified, comprise a single sub-pixel or a pixel that includes two or more sub-pixels of an electrowetting display device. Such a pixel or sub-pixel may be the smallest light transmissive, reflective or transflective element of a display that is individually operable to directly control an amount of light transmission through and/or reflection from the element. For example, in some implementations, a pixel may be a red sub-pixel, a green sub-pixel, a blue sub-pixel or a white sub-pixel of a larger pixel or may, in some cases, include a number of sub-pixels. As such, a pixel may be a pixel that is a smallest component, e.g., the pixel does not include any sub-pixels.

Rows and columns of electrowetting pixels are operated by controlling voltage levels on a plurality of source lines and gate lines. In this fashion, the display device may produce an image by selecting particular pixels to transmit, reflect or block light. Pixels are addressed (e.g., selected) via rows and columns of the source lines and the gate lines that are electrically connected to transistors (e.g., used as switches) included in each pixel. The transistors take up a relatively small fraction of the area of each pixel to allow light to efficiently pass through (or reflect from) the display pixel.

Electrowetting displays include an array of pixels sandwiched between two support plates, such as a bottom support plate and a top support plate. For example, a bottom support plate in cooperation with a top support plate may contain pixels that include electrowetting oil, electrolyte solution and pixel walls between the support plates. Support plates may include glass, plastic (e.g., a transparent thermoplastic such as a poly(methyl methacrylate) (PMMA) or other acrylic), or other transparent material and may be made of a rigid material or a flexible material, for example. Pixels include various layers of materials built upon a bottom support plate. One example layer is a hydrophobic layer, e.g. a fluoropolymer layer, around portions of which pixel walls are built.

Hereinafter, example embodiments include, but are not limited to, reflective electrowetting displays that include a clear, transparent, or semi-transparent top support plate and a bottom support plate, which need not be transparent. The clear top support plate may comprise glass or any of a number of transparent materials, such as transparent plastic, quartz, and semiconductors, for example, and claimed subject matter is not limited in this respect. "Top" and "bottom" as used herein to identify the support plates of an electrowetting display do not necessarily refer to a direction referenced to gravity or to a viewing side of the electrowetting display. Also, as used herein for the sake of convenience of describing example embodiments, the top support plate is that through which viewing of pixels of a (reflective) electrowetting display occurs.

In some embodiments, a reflective electrowetting display comprises an array of pixels sandwiched between a bottom support plate and a top support plate. The bottom support plate may be opaque while the top support plate is transparent. Herein, describing a pixel or material as being transparent generally means that the pixel or material may transmit or enable the propagation of a relatively large fraction of the light incident upon it. For example, a transparent material or layer may transmit or propagate more than 70% or 80% of the light impinging on its surface, though claimed subject matter is not limited in this respect. In contrast, opaque generally means that the pixel or material may block or inhibit the transmission or propagation of at least a portion of the visible light spectrum incident upon it. For example, a black opaque material or layer may block, absorb, or otherwise prevent the propagation of more than 70% or 80% of the light impinging on its surface, though claimed subject matter is not limited in this respect. In the present disclosure, materials that are described as preventing the propagation of light shall be understood to prevent propagation of at least 70% of the light striking the material. Alternatively, the opaque material may be transmissive for a portion of the visible light spectrum and blocking other portions, forming a color filter. Similarly, materials that are described as being transparent or allowing propagation of light shall be understood to transmit or propagate at least 70% of the light striking the material. Within a conventional display device, the black matrix material may absorb up to 97% of electromagnetic radiation striking the black matrix material. In this description, the visible light spectrum may include light having a wavelength between 390 nanometers (nm) and 700 nm.

Pixel walls retain at least a first fluid which is electrically non-conductive, such as an opaque or colored oil, in the individual pixels. A cavity formed between the support plates is filled with the first fluid (e.g., retained by pixel walls) and a second fluid (e.g., considered to be an electrolyte solution) that is electrically conductive or polar and may be a water or a salt solution such as a solution of potassium chloride water. The second fluid may be transparent, but may be colored, or light-absorbing in some embodiments. The second fluid is immiscible with the first fluid.

Individual reflective electrowetting pixels may include a reflective layer on the bottom support plate of the electrowetting pixel, a transparent electrode layer adjacent to the reflective layer, and a hydrophobic layer on the electrode layer. Alternatively, the reflective layer may act as the pixel electrode. Pixel walls, associated with and formed around each pixel, the hydrophobic layer, and the transparent top support plate at least partially enclose a fluid region that includes an electrolyte solution and an opaque fluid, which is immiscible with the electrolyte solution. An "opaque" fluid, as described herein, is used to describe a fluid that appears black or to have color to an observer. For example, an opaque fluid appears black to an observer when it strongly absorbs a broad spectrum of wavelengths (e.g., including those of red, green and blue light) in the visible region of light or electromagnetic radiation. In some embodiments, the opaque fluid is a nonpolar electrowetting oil.

The opaque fluid is disposed in the fluid region. A coverage area of the opaque fluid on the bottom hydrophobic layer is electrically adjustable to affect the amount of light incident on the reflective electrowetting display that reaches the reflective material at the bottom of each pixel.

In addition to pixels, spacers and edge seals may also be located between the two support plates.

Spacers and edge seals that mechanically connect the first support plate with and opposite to the second overlying support plate, or which form a separation between the first support plate and the second support plate, contribute to the mechanical integrity of the electrowetting display. Edge seals, for example, being disposed along a periphery of an array of electrowetting pixels, may contribute to retaining fluids (e.g., the first and second fluids) between the first support plate and the second overlying support plate. Spacers can be at least partially transparent so as to not hinder throughput of light in the electrowetting display. The transparency of spacers may at least partially depend on the refractive index of the spacer material, which can be similar to or the same as the refractive indices of surrounding media. Spacers may also be chemically inert to surrounding media.

In some embodiments, a display device as described herein may comprise a portion of a system that includes one or more processors and one or more computer memories, which may reside on a control board, for example. Display software may be stored on the one or more memories and may be operable with the one or more processors to modulate light that is received from an outside source (e.g., ambient room light) or out-coupled from a lightguide of the display device. For example, display software may include code executable by a processor to modulate optical properties of individual pixels of the electrowetting display based, at least in part, on electronic signals representative of image and/or video data. The code may cause the processor to modulate the optical properties of pixels by controlling electrical signals (e.g., voltages, currents, and fields) on, over, and/or in layers of the electrowetting display.

Figure 1B:
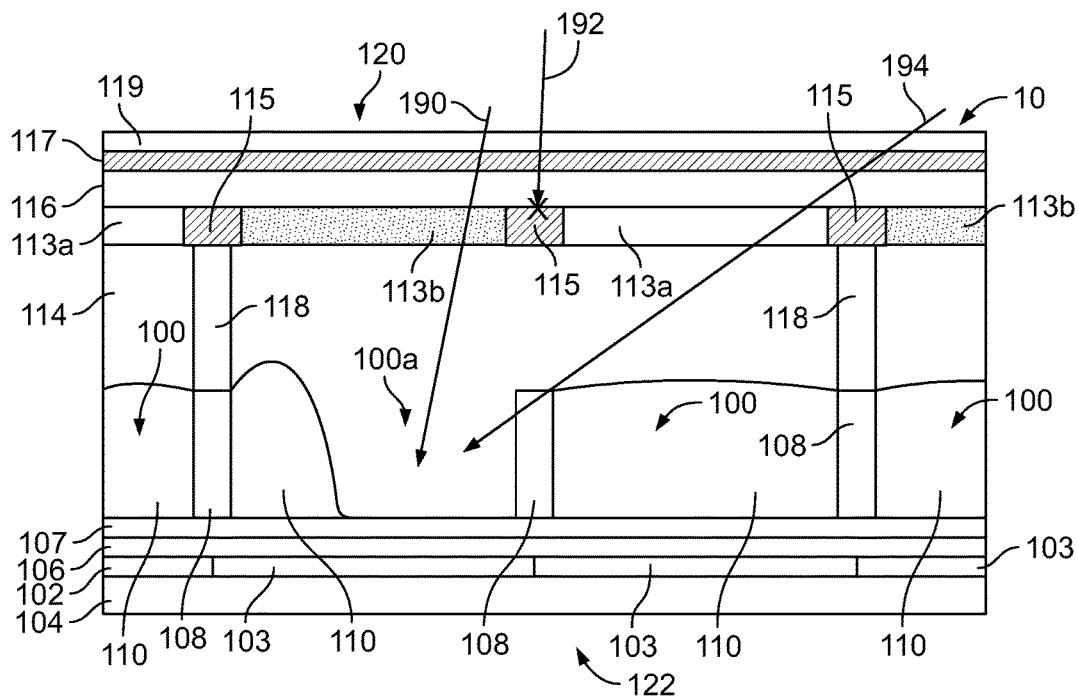
Figure 2:
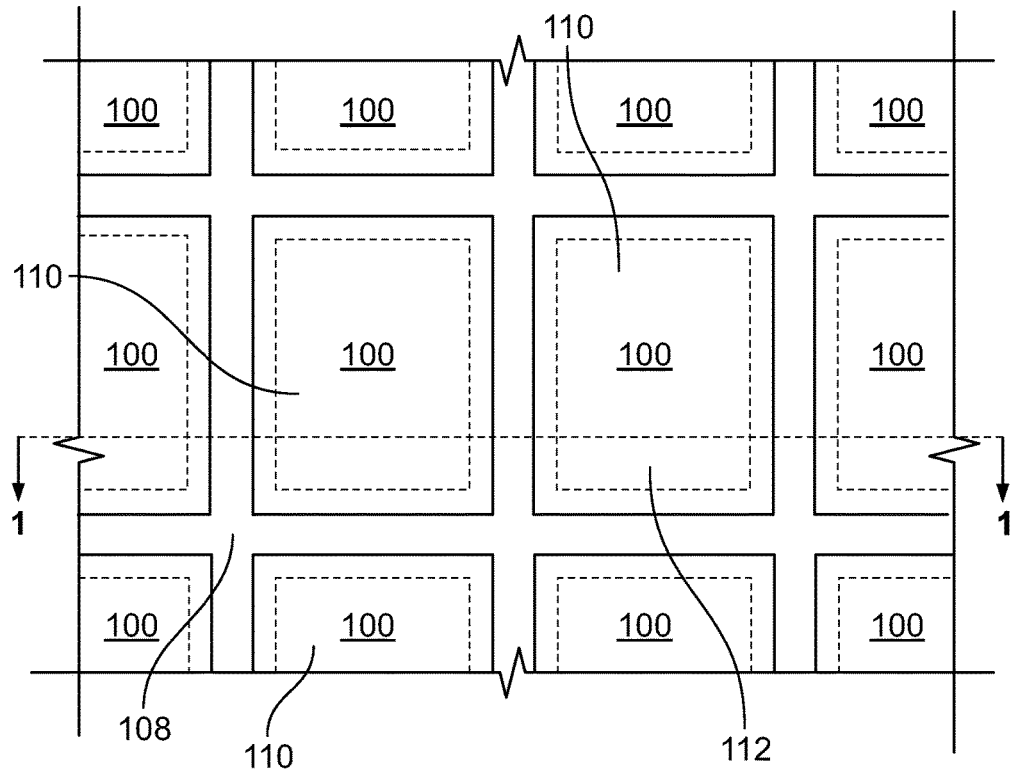
FIG. 2 illustrates a top view of the electrowetting pixels of FIGS. 1A and 1B mostly exposed by an electrowetting fluid, according to various embodiments.

FIG. 1A is a cross-section of a portion of an example conventional reflective electrowetting display device 10 illustrating several electrowetting pixels 100 taken along sectional line 1-1 of FIG. 2. FIG. 1B shows the same cross-sectional view as FIG. 1A in which an electric potential has been applied to one of the electrowetting pixels 100 causing displacement of a first fluid disposed therein, as described below. FIG. 2 shows a top view of electrowetting pixels 100 formed over a bottom support plate 104. The view shown in FIG. 2 is simplified and does not depict each component illustrated in FIGS. 1A and 1B and primarily illustrates the row and column layout of pixels 100.

In FIGS. 1A and 1B, two complete electrowetting pixels 100 and two partial electrowetting pixels 100 are illustrated. Electrowetting display device 10 may include any number (usually a very large number, such as thousands or millions) of electrowetting pixels 100. An electrode layer 102 is formed on a bottom support plate 104.

In various embodiments, electrode layer 102 consists of individual pixel electrodes 103, each addressing an individual pixel. The individual pixel electrodes may be connected to a transistor, such as a thin film transistor (TFT) (not shown), that is switched or otherwise controlled to either select or deselect an electrowetting pixel 100 using an active matrix addressing scheme, for example. A TFT is a particular type of field-effect transistor that includes thin films of an active semiconductor layer as well as a dielectric layer and metallic contacts over a supporting (but non-conducting) substrate, which may be glass or any of a number of other suitable transparent or non-transparent materials, for example. The TFTs and corresponding data lines may be formed within electrode layer 102 or within other layers over or within support plate 104.

In some embodiments, a dielectric barrier layer 106 may at least partially separate electrode layer 102 from a hydrophobic layer 107, also formed on bottom support plate 104. Barrier layer 106 may be formed from various materials including organic/inorganic multilayer stacks or layers. In some embodiments, hydrophobic layer 107 is an amorphous fluoropolymer layer including any suitable fluoropolymer(s), such as AF1600®, produced by DuPont, based in Wilmington, Del. Hydrophobic layer 107 may also include suitable materials that affect wettability of an adjacent material, for example.

Pixel walls 108 form a patterned electrowetting pixel grid on hydrophobic layer 107. Pixel walls 108 may comprise a photoresist material such as, for example, epoxy-based negative photoresist SU-8. The patterned electrowetting pixel grid comprises rows and columns that form an array of electrowetting pixels. For example, an electrowetting pixel may have a width and a length in a range of about 50 to 500 micrometers.

A first fluid 110, which may have a thickness (e.g., a height) in a range of about 1 to 10 micrometers, for example, overlays hydrophobic layer 107. First fluid 110 is partitioned by pixel walls 108 of the patterned electrowetting pixel grid. A second fluid 114, such as an electrolyte solution, overlays first fluid 110 and pixel walls 108 of the patterned electrowetting pixel grid. First fluid 110 is immiscible with second fluid 114.

Color filters 113a, 113b (collectively, 113) are positioned over each of pixels 100. Each color filter 113 may be configured to be substantially transparent to particular ranges of wavelengths of light, while absorbing others. For example, color filter 113a may be transparent to red light having wavelengths ranging from 620 nm to 750 nm, while absorbing light having other wavelengths. Conversely, color filter 113b may be transparent to green light having wavelengths ranging from 495 nm to 570 nm, while absorbing light having other wavelengths. Various pixels 100 within device 10 may be associated with color filters 113 that are transparent to all wavelengths of visible light, namely white light. As used herein, visible light refers to wavelengths of electromagnetic radiation visible to the human eye. Generally, this includes electromagnetic radiation having wavelengths between about 400 nm to about 700 nm.

Color filters 113, therefore, may be utilized to assign each pixel 100 a color, so that when a particular pixel 100 is in an open state, light reflected by that pixel will take on the color of the color filter 113 associated with that pixel 100.

In an attempt to prevent cross-talk, device 10 includes a number of black matrix members 115 positioned over each pixel wall 108 in device 10. Black matrix members 115 may include Chromium containing compounds like Chromium oxides, and Chromium nitrides configured to absorb all wavelengths of visible light and therefore reduce an amount of light that may enter device 10 over one pixel while exiting device 10 over a second pixel. Due to their size, in conventional device designs, black matrix member 115 may block up to 20% of the light striking device 10.

A support plate 116, in conjunction with color filters 113 and black matrix members 115, covers second fluid 114 and spacers 118 to maintain second fluid 114 over the electrowetting pixel array. A diffuser film may be formed over or, in some cases, integrated into a portion of, support plate 116 to diffuse light striking a surface of support plate 116 and passing therethrough.

In one embodiment, spacers 118 extend to support plate 116 and may rest upon a top surface of one or more pixel walls 108. Multiple spacers 118 may be interspersed throughout the array of pixels 100. The dimensions and shape of the spacers is not restricted to pillar shape as shown in FIG. 1A, alternative shapes include crosses, lines of spacers, or full grid spacer structures.

In some embodiments of device 10, a front light component may be positioned over an edge of viewing side 120 of device 10. In these embodiments, a light guide 117 may be positioned over device 10 to guide light generated by the front light component over viewing side 120 of device 10.

A layer 119, e.g. glass or other material, incorporating various touch-sensitive structures may also be positioned over device 10.

A voltage applied across, among other things, second fluid 114 and a pixel electrode in electrode layer 102 addressing a particular electrowetting pixel may control transmittance or reflectance of individual electrowetting pixels 100.

Reflective electrowetting display device 10 has viewing side 120 on which an image formed by electrowetting display device 10 may be viewed, and an opposing rear side 122. Support plate 116 faces viewing side 120 and bottom support plate 104 faces rear side 122. Reflective electrowetting display device 10 may be a segmented display type in which the image is built of segments. The segments may be switched simultaneously or separately. Each segment includes one electrowetting pixel 100 or a number of electrowetting pixels 100 that may be adjacent or distant from one another. Electrowetting pixels 100 included in one segment are switched simultaneously, for example. Electrowetting display device 10 may also be an active matrix driven display type or a passive matrix driven display, for example.

As mentioned above, second fluid 114 is immiscible with first fluid 110. Herein, substances are immiscible with one another if the substances do not substantially form a solution. Second fluid 114 is electrically conductive and/or polar, and may be water or a salt solution such as a solution of potassium chloride in water, for example. In certain embodiments, second fluid 114 is transparent, but may be colored or light absorbing. First fluid 110 is electrically non-conductive and may for instance be an alkane like hexadecane or (silicone) oil.

Hydrophobic layer 107 is arranged on bottom support plate 104 to create an electrowetting surface area. The hydrophobic character of hydrophobic layer 107 causes first fluid 110 to adhere preferentially to hydrophobic layer 107 because first fluid 110 has a higher wettability with respect to the surface of hydrophobic layer 107 than second fluid 114 in the absence of a voltage. Wettability relates to the relative affinity of a fluid for the surface of a solid. Wettability increases with increasing affinity, and it may be measured by the contact angle formed between the fluid and the solid and measured internal to the fluid of interest. For example, such a contact angle may increase from relative non-wettability of more than 90° to complete wettability at 00, in which case the fluid tends to form a film on the surface of the solid.

In some embodiments, first fluid 110 absorbs light within at least a portion of the optical spectrum and so may form a color filter. The fluid may be colored by addition of pigment particles or dye, for example. Alternatively, first fluid 110 may be black (e.g., absorbing substantially all light within the optical spectrum) or reflecting. Hydrophobic layer 107 may be transparent or reflective. A reflective layer may reflect light within the entire visible spectrum, making the layer appear bright, or reflect a portion of light within the visible spectrum, making the layer have a color.

If a voltage is applied across an electrowetting pixel 100, electrowetting pixel 100 will enter into an active or at least partially open state. Electrostatic forces will move second fluid 114 toward electrode layer 102 within the active pixel, thereby displacing first fluid 110 from that area of hydrophobic layer 107 to pixel walls 108 surrounding the area of hydrophobic layer 107, to a droplet-like form. Such displacing action at least partly uncovers first fluid 110 from the surface of hydrophobic layer 107 of electrowetting pixel 100.

FIG. 1B shows one of electrowetting pixels 100 in an active state. With an electric potential applied to a pixel electrode in electrode layer 102 underneath the activated electrowetting pixel 100, second fluid 114 is attracted towards a pixel electrode in electrode layer 102 displacing first fluid 110 within the activated electrowetting pixel 100.

As second fluid 114 moves towards hydrophobic layer 107 of the activated electrowetting pixel 100, first fluid 110 is displaced and moves towards a pixel wall 108 of the activated pixel 100 or is otherwise displaced. In the example of FIG. 1B, first fluid 110 of pixel 100a has formed a droplet as a result of an electric potential being applied to pixel 100a. After activation, when the voltage across electrowetting pixel 100a is returned to an inactive signal level of zero or a value near to zero, electrowetting pixel 100a will return to an inactive or closed state, where first fluid 110 flows back to cover hydrophobic layer 107. In this way, first fluid 110 forms an electrically controllable optical switch in each electrowetting pixel 100.

As shown in FIG. 1B, with first fluid 110 of pixel 100a displaced, light ray 190 can enter pixel 100a through color filter 113b, strike the reflective surface at the bottom of pixel 100a and reflect back out through color filter 113b. Black matrix members 115, however, are configured to block some of the light striking viewing side 120 of device 10. As shown in FIG. 1B, light ray 192, which strikes the surface of device 10 nearly normal to viewing side 120, is blocked by one of the black matrix members 115 and so cannot enter pixel 100a to be reflected therefrom.

Additionally, because pixel walls 108 are transparent to all wavelengths of visible light, oblique light ray 194, which entered device 10 over pixel 100 to the right of pixel 100a, will pass through pixel wall 108, enter pixel 100a and be reflected therefrom. As such, light ray 194 represents crosstalk that may diminish the performance of device 10.

Figure 3:
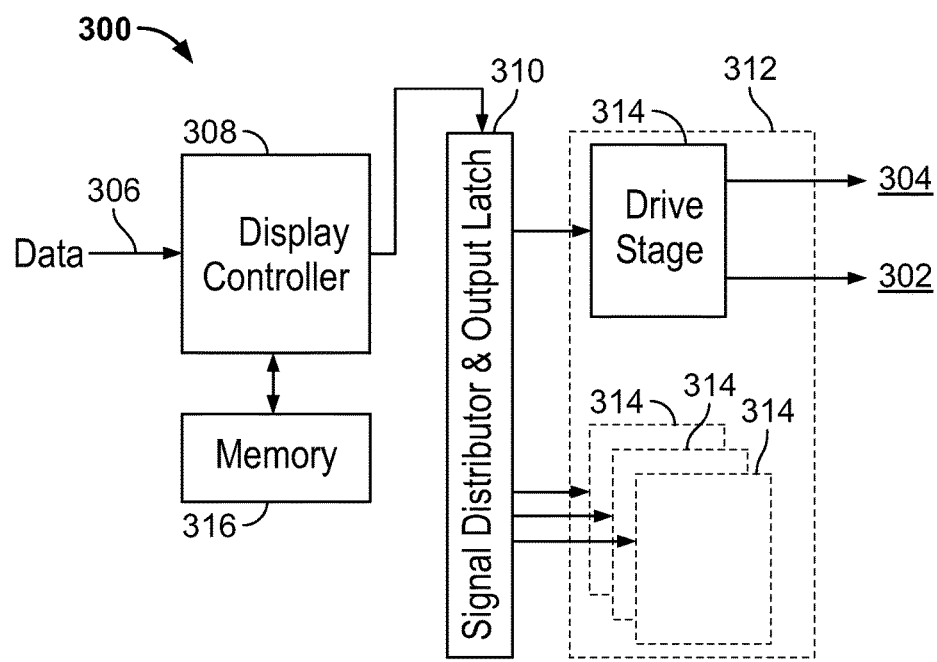
FIG. 3 is a block diagram of an example embodiment of an electrowetting display driving system, including a control system of the electrowetting display device.

FIG. 3 shows a block diagram of an example embodiment of an electrowetting display driving system 300, including a control system of the display device. Display driving system 300 can be of the so-called direct drive type and may be in the form of an integrated circuit adhered to bottom support plate 104. Display driving system 300 includes control logic and switching logic, and is connected to the display by means of electrode signal lines 302 and a common signal line 304. Each electrode signal line 302 connects an output from display driving system 300 to a different electrode within each pixel 100, respectively. Common signal line 304 is connected to second fluid 114 through a common electrode, e.g. an electrode deposited over the color filter layer on the top support plate. Also included are one or more input data lines 306, whereby display driving system 300 can be instructed with data so as to determine which pixels 100 should be in an active or open state and which pixels 100 should be in an inactive or closed state at any moment of time. In this manner, display driving system 300 can determine a target reflectance value for each pixel 100 within the display.

Electrowetting display driving system 300 as shown in FIG. 3 includes a display controller 308, e.g., a microcontroller, receiving input data from input data lines 306 relating to the image to be displayed. Display controller 308, being in this embodiment the control system, is configured to apply a voltage to the first electrode to establish a particular display state (i.e., reflectance value) for a pixel 100. The microcontroller controls a timing and/or a signal level of at least one signal level for a pixel 100.

The output of display controller 308 is connected to the data input of a signal distributor and data output latch 310.

Signal distributor and data output latch 310 distributes incoming data over a plurality of outputs connected to the display device, via drivers in certain embodiments. Signal distributor and data output latch 310 cause data input indicating that a certain pixel 100 is to be set in a specific display state to be sent to the output connected to pixel 100. Signal distributor and data output latch 310 may be a shift register. The input data is clocked into the shift register and at receipt of a latch pulse the content of the shift register is copied to signal distributor and data output latch 310. Signal distributor and data output latch 310 has one or more outputs, connected to a driver assembly 312. The outputs of signal distributor and data output latch 310 are connected to the inputs of one or more driver stages 314 within electrowetting display driving system 300. The outputs of each driver stage 314 are connected through electrode signal lines 302 and common signal line 304 to a corresponding pixel 100. In response to the input data, a driver stage 314 will output a voltage of the signal level set by display controller 308 to set one of pixels 100 to a corresponding display state having a target reflectance level.

To assist in setting a particular pixel to a target reflectance level, memory 316 may also store data that maps a particular driving voltage for a pixel to a corresponding reflectance value and vice versa. The data may be stored as one or more curves depicting the relationship between driving voltage and reflectance value, or a number of discrete data points that map a driving voltage to a reflectance value and vice versa. As such, when display controller 308 identifies a target reflectance value for a particular pixel, display controller 308 can use the data mapping driving voltage to reflectance value to identify a corresponding driving voltage. The pixel can then be driven with that driving voltage.

In the present display device a pixel wall configuration is presented in which the pixels walls are configured with regions arranged to filter particular wavelengths of light. By filtering particular wavelengths of light, cross-talk between pixels can be minimized, reducing overall image distortion and cross-talk related artifacts. In one embodiment, each pixel in the display device is surrounded by a pixel wall arrangement in which the pixel walls are preventing propagation of light having a wavelength other than that desired to be reflected by the pixel. For example, the pixel walls around a pixel may be configured to filter and block light in the same manner as a color filter positioned over the pixel. As such, light from a first pixel of a first wavelength cannot propagate through the pixel wall and enter a second pixel of a second color. Because cross-talk is limited in the present pixel wall design, the black matrix materials of conventional devices can be omitted, thereby allowing more light to enter the display device overall, increasing the display device's brightness.

Figure 4A:
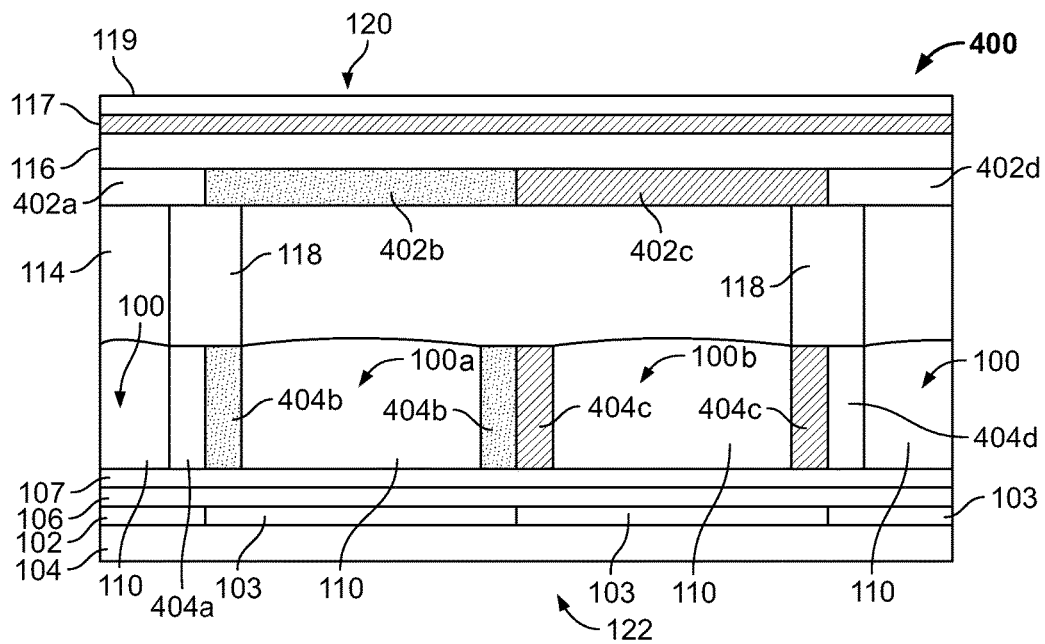
FIGS. 4A and 4B illustrate cross-sectional views of a portion of an electrowetting display device in which different pixel walls of the display device are transparent to different wavelengths of electromagnetic radiation.
Figure 4B:
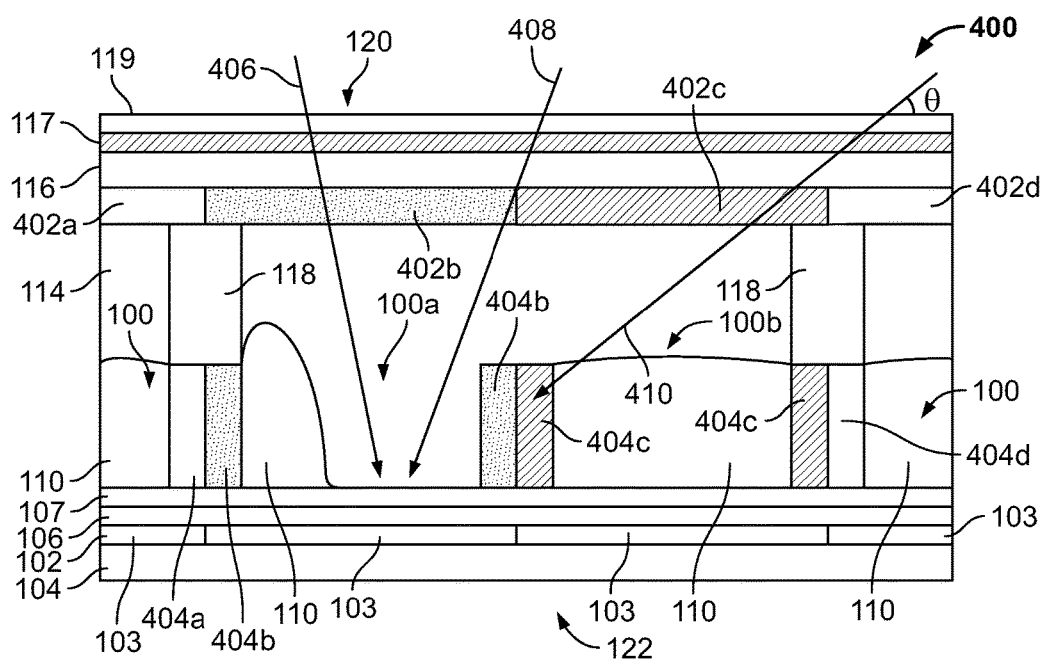
Figure 5:
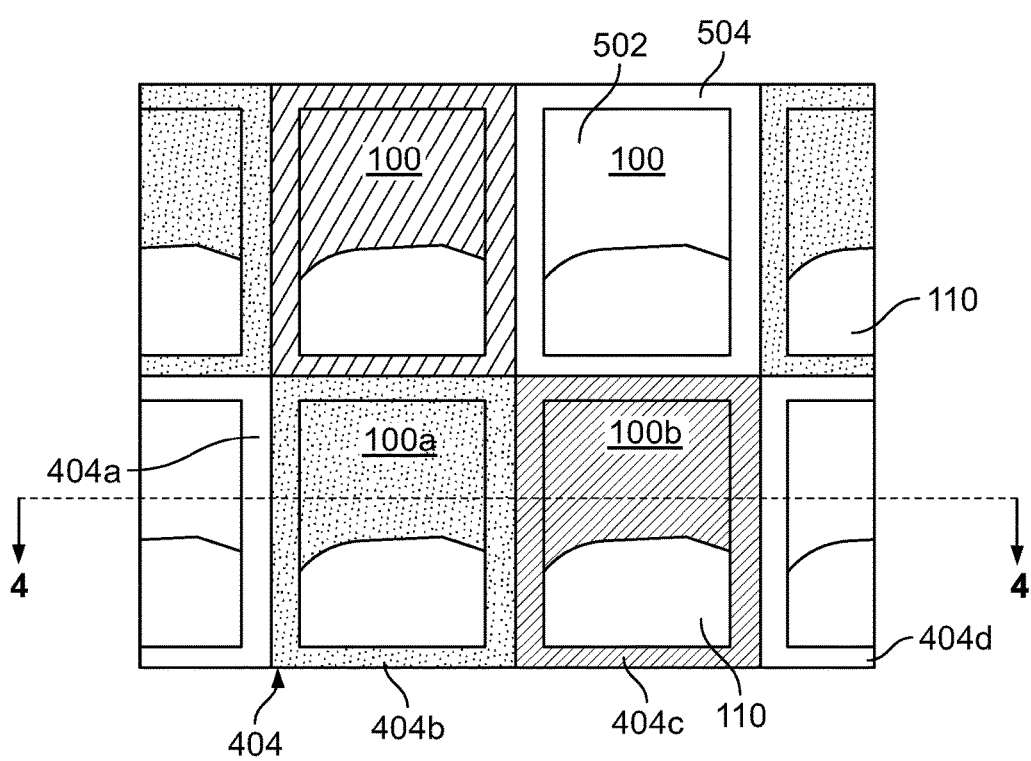
FIG. 5 illustrates a top view of the electrowetting pixels of FIGS. 4A and 4B mostly exposed by an electrowetting fluid, according to various embodiments.

FIG. 4A is a cross-section of a portion of an example electrowetting display device 400 illustrating several electrowetting pixels 100 taken along sectional line 4-4 of FIG. 5. FIG. 4B shows the same cross-sectional view as FIG. 4A in which an electric potential has been applied to one of the electrowetting pixels 100a causing displacement of a first fluid disposed therein, as described below. FIG. 5 shows a top view of electrowetting pixels 100 formed over a bottom support plate 104. The view shown in FIG. 5 is simplified and does not depict each component illustrated in FIGS. 1A and 1B and primarily illustrates the row and column layout of pixels 100. In FIGS. 4A, 4B, and 5, items with the same element number as in FIGS. 1A, 1B, and 2 are of similar construction.

In FIGS. 4A and 4B, two complete electrowetting pixels 100 and two partial electrowetting pixels 100 are illustrated. Electrowetting display device 400 may include any number (usually a very large number, such as thousands or millions) of electrowetting pixels 100.

Each pixel 100 is associated with a color filter 402. Colors filters 402 (including color filters 402a, 402b, 402c, and 402d) may be constructed with a generally transparent material such as a photoresist material or photo-definable polymer, including electromagnetic radiation filtering materials suspended within the material. Color filters 402a, 402b, 402c, and 402d may be formed by the addition of pigments or dyes to a clear photo-definable polymer, for example. The amount of additive depends on system requirements, such as absorbance or transmission specifications. In some cases, polyacrylates are used as photoresist material. General, the organic dyes and pigments used within color filters 402a, 402b, 402c, and 402d can have molecular structures containing chromophoric groups generating the color filtering properties. Some examples for chromophoric groups are azo-, anthraquinone-, methine- and phtalocyanine-groups.

Color filters 402 may also be formed using a dichromated gelatin doped with a photosynthesizer, dyed polyimides, resins, and the like.

Color filters 402 are configured to overlay each pixel 100 entirely so that the color filters 402 extend from directly over a midpoint of one pixel wall 108 on a first side of a pixel 100 to a position directly over a midpoint of another pixel wall 108 on a second side of the pixel 100. In this configuration, no black matrix material is formed or otherwise positioned between each color filter 402, in contrast to the device 10 configuration illustrated in FIGS. 1A and 1B.

In one embodiment, device 400 includes a combination of red, blue, green, and white color filters 402, with one color filter 402 being positioned over each pixel 100. Using color filters 402, each pixel 100 in device 400 can be associated with a particular wavelength of electromagnetic radiation. By controlling which pixels 100 are active within device 400, device 400 can generate color images viewable by a user at viewing side 120. In one embodiment, the red color filters 402 may be transparent to red light having wavelengths ranging from 620 nm to 750 nm, while being absorbing light having other wavelengths. A blue color filter 402 may be transparent to blue light having wavelengths ranging from 450 nm to 495 nm, while being absorbing to light having other wavelengths. A green color filter 402 may be transparent to green light having wavelengths ranging from 495 nm to 570 nm, while being absorbing to light having other wavelengths. A white color filter 402 may be transparent to all wavelengths of visible light. In other embodiments, different ranges of light wavelengths may be associated with the red, blue and green color filters 402. In still other embodiments, the color filters 402 may be configured to block or transmit electromagnetic radiation of different wavelengths entirely. For example, device 400 may be configured to generate images using pixels 100 having color filters 402 configured to transmit electromagnetic radiation of the colors cyan, magenta, and yellow. In short, color filters 402 may be developed and utilized within device 400 in accordance with any display color model.

Pixel walls 404, including separate regions 404a, 404b, 404c, and 404d are formed about each pixel 100. Accordingly, each pixel wall 404 is associated with one or more of pixels 100. Each region 404a, 404b, 404c, and 404d of pixel walls 404 are configured to transmit and block different wavelengths of electromagnetic radiation. Within device 400, the regions of pixel walls 404 immediately surrounding each pixel 100 will be configured to block and transmit wavelengths of electromagnetic radiation in the same manner as the color filter 402 associated with pixel 100. For example, with reference to FIGS. 4A and 4B, if color filter 402b is configured to transmit red light, but block other wavelengths of electromagnetic radiation, region 404b of pixel wall 404 is configured to also transmit red light, while blocking other wavelengths of electromagnetic radiation.

In FIGS. 4A and 4B, pixel 100a and pixel 100b are adjacent pixels within the display device. Pixels 100 are adjacent when they are next to one another in the display device with no intervening pixel 100 between. A pixel wall 404 is formed between pixel 100a and pixel 100b so that a region 404b of the pixel wall 404 between pixel 100a and 100b runs along a boundary between pixel 100a and pixel 100b. Similarly, region 404c of the pixel wall 404 between pixel 100a and 100b runs along the same boundary between pixel 100a and pixel 100b.

The different regions 404a, 404b, 404c, and 404d of pixel walls 404 may be formed in a multi-step photolithography process, as described below, or may be formed together as part of a unitary pixel wall 404 structure. In some cases, a reflective material may be deposited at the interface between regions 404a, 404b, 404c, and 404d of pixel walls 404. The materials making up pixel walls 404 and, particularly, the different color filter regions 404a, 404b, 404c, and 404d of pixel walls 404 may be similar or, in fact, the same as the materials making up color filters 402. In some embodiments, however, the amount of color filter material formed within regions 404a, 404b, 404c, and 404d of pixel walls 404 may be different than that of the color filters 402 so that regions 404a, 404b, 404c, and 404d may be more or less transparent to electromagnetic radiation of a particular wavelength than corresponding color filter 402.

In this arrangement, not only do color filters 402 play a role in controlling the wavelengths of electromagnetic radiation outputted by each pixel 100, but pixel walls 404 also play a role. With reference to FIG. 1B, for example, light ray 406 can enter the open pixel 100a and be reflected out through color filter 402b. If, for example, color filter 402b is configured to transmit red light, while blocking other wavelengths of electromagnetic radiation, only the red portion of light ray 406 will enter pixel 100a and be reflected out. Other wavelengths of electromagnetic radiation within light ray 406 will be blocked by color filter 402b.

Light ray 408 can also enter pixel 100a and be reflected out through color filter 402b. This is the case even though light ray 408 enters device 400 at a location above pixel wall 404. In a conventional device (see, for example, FIGS. 1A and 1B), a black matrix material is positioned over the device's pixel walls and would have blocked light ray 408. The configuration of device 400 illustrated in FIGS. 4A and 4B, therefore, allows more light to enter device 400 in contrast to conventional configurations, thereby increasing the overall brightness of device 400. In one embodiment, for example, where pixels 100 each have a length of 120 micrometers and a width of 60 micrometers, and where the black matrix material in a conventional device has a width of 12 microns, the brightness in the present device 400 may increase over the conventional design by up to approximately 20%.

The configuration of pixel walls 404 may also operate to prevent or minimize cross-talk within device 400. In one example, light ray 410 strikes viewing side 120 of device 400 at a sufficiently small angle θ that it might enter device 400 over pixel 100b (a green pixel), but pass into pixel 100a (a red pixel). The angle θ at which light ray 410 would pass from one pixel 100 to another may depend upon the dimensions of pixels 100, the total thickness of the fluid layers between the bottom and top support plate and the height of fluid 110 within pixels 100. For example, in some devices 440 the total thickness of the fluid layers between the bottom and top support plate may ranges from 20-50 micrometers, pixel 100 wall 404 height may range from 1-10 micrometers, and pixel 100 widths and lengths may ranges from 50-500 micrometers. Instead, however, light ray 410 strikes color filter 402c, which only allows particular wavelengths of electromagnetic radiation to pass. As such, color filter 402c only allows the green portion of light ray 410 to pass. The green portion of light ray 410 then enters the pixel wall 404 as depicted. In a conventional design, in which the pixel walls are constructed from transparent materials, the green portion of light ray 410 would be free to enter the red pixel 100a. In this example, however, the pixel wall 404 configuration prevents cross-talk. In this example, the green portion of light ray 410 passes through region 404c of pixel wall 404, which is configured to transmit green light. But the green portion of light ray 410 is blocked by region 404b of pixel wall 404, which is configured to only transmit red light, while absorbing green light. Accordingly, the green portion of light ray 410 is terminated at the pixel wall 404 and does not enter pixel 100a.

In many embodiments, a particular pixel 100 of device 400 is associated with a particular color or wavelengths of electromagnetic radiation, so that both the color filter 402 over a particular pixel 100, as well as the pixel walls 404 surrounding the pixel 100 are all of the same color—that is, they transmit the same wavelengths of electromagnetic radiation, while inhibiting the transmission of other wavelengths of electromagnetic radiation. In the case of a white pixel 100—a pixel that is configured to reflect white light—that may mean that the color filter 402 over the pixel is transparent to all wavelengths of electromagnetic radiation (in some cases, no color filter may be used). Similarly, the regions of the pixel walls 404 surrounding a white pixel 100 may also be transparent to all wavelengths of electromagnetic radiation. This arrangement is illustrated in FIG. 5 in which white pixel 502 is surrounded by transparent pixel wall 404 regions 504.

Figure 6:
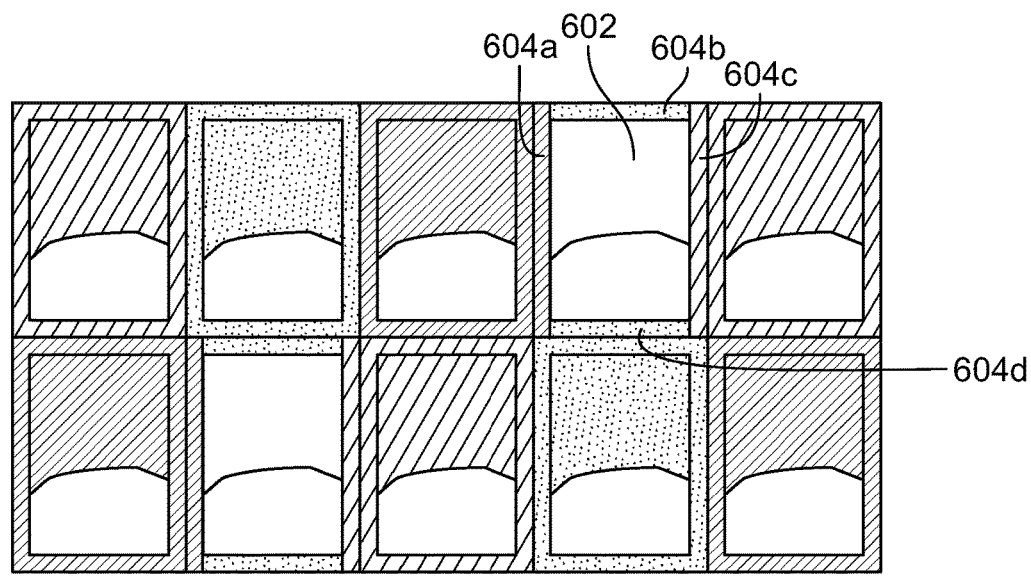
FIGS. 6 and 7 are top views of an electrowetting display device including a number of white pixels.

In other configurations, however, white pixels 100 within device 400 may be surrounded by pixel wall regions 404 that are transparent to a number of different wavelengths of electromagnetic radiation. FIG. 6, for example, shows a top view of a pixel configuration in which the pixel walls 604a, 604b, 604c, and 604d surrounding the device's white pixel 602 are configured to filter light in the same manner as the neighboring pixels. In other words, the pixel wall structures surrounding each white pixel 602 is an extension of the pixel walls defining the neighboring pixels. With reference to a particular white pixel 602 depicted in FIG. 6, the pixel wall defining the left side of the white pixel 602 is configured to transmit the same wavelengths of electromagnetic radiation as the pixel to the left of the white pixel; the pixel wall defining the right side of the white pixel 602 is configured to transmit the same wavelengths of electromagnetic radiation as the pixel to the right of the white pixel; the pixel wall defining the top side of the white pixel 602 is configured to transmit the same wavelengths of electromagnetic radiation as the pixel to the top of the white pixel; and the pixel wall defining the bottom side of the white pixel 602 is configured to transmit the same wavelengths of electromagnetic radiation as the pixel to the bottom of the white pixel.

Figure 7:
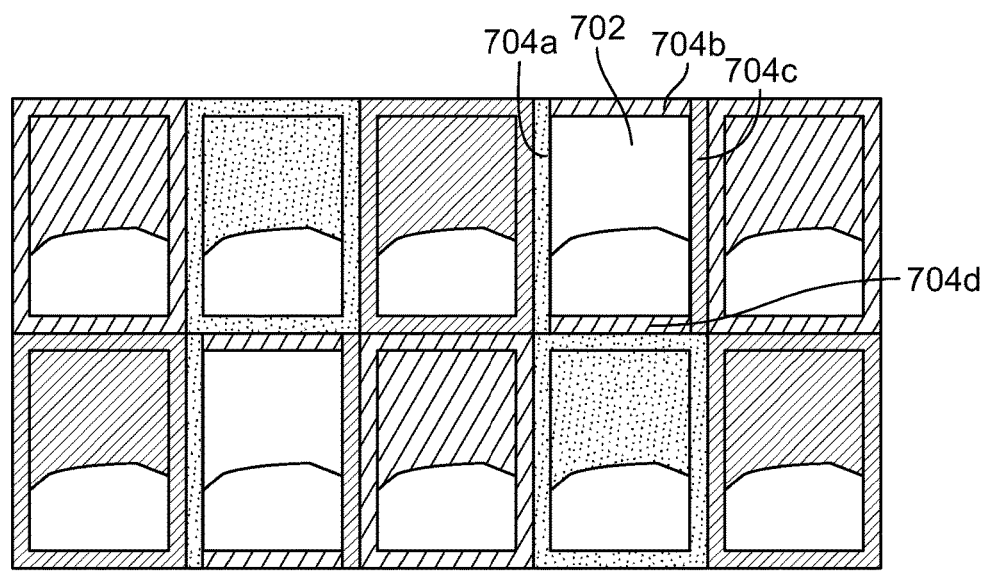

FIG. 7 shows a top view of a pixel configuration depicting another alternative white pixel configuration in which each pixel wall 704a, 704b, 704c, and 704d of white pixel 702 is configured to transmit different wavelengths of electromagnetic radiation. Although this embodiment may allow colored light from the neighboring pixels to enter white pixel 702, the colored light from the neighboring pixels will mix, resulting in an output of white light from white pixel 702.

The pixel walls of the present disclosure may be fabricated using any suitable process for forming and shaping pixel wall structures that are transparent to particular wavelengths of electromagnetic radiation, while absorbing other wavelengths. Example processes for forming the pixel walls include, without limitation, lithography, embossing, imprinting and electroforming. In one example manufacturing process, FIGS. 8A-8I illustrate cross-sectional views of device 800 depicting steps in a photolithography process for forming pixel walls in accordance with the present disclosure. In a first step depicted in FIG. 8A, a multilayer stack 802 is first formed. The multilayer stack includes a first conductive layer deposited on a first support plate. In one embodiment, the first conductive layer is indium tin oxide (ITO), although in alternative embodiments the first conductive layer may be another suitable material. Deposition techniques include, for example, chemical vapor deposition (CVD), physical vapor deposition (PVD), molecular beam epitaxy (MBE), and sputtering. The first support plate may be the same as or similar to support plate 104 illustrated in FIGS. 1A and 1B.

The multilayer stack includes a first dielectric layer deposited on the first conductive layer of multilayer stack 802. The first dielectric layer may comprise SiN, SiON, SiO, or TaO, for example. Any suitable deposition technique may be used, such as CVD, PVD, MBE, and a sputtering, for example. A hydrophobic layer (e.g., hydrophobic layer 107, illustrated in FIGS. 1A and 1B) may be deposited over the patterned first dielectric layer. The pixel walls may be formed as illustrated in FIGS. 8A-8I before or after the application of the hydrophobic layer to the multilayer stack.

Photoresist material 804, such as epoxy-based negative photoresist SU-8, is deposited over multilayer stack 802. Photoresist material 804 is configured to be transparent to first wavelengths of electromagnetic radiation (e.g., blue), while preventing propagation of other wavelengths of electromagnetic radiation. This behavior may be achieved by adding pigments or dyes to the photoresist material. The amount of pigments or dyes determines the transparency of the final pixel wall portion to a specific wavelength or wavelength regime and the absorption of the other wavelengths of electromagnetic radiation. The color of the pixel wall portion is determined by the type and concentration of pigments or dye materials used. The pixel walls may include similar amounts of dye or pigment materials so as to provide the same color-filtering properties as color filters that may be positioned over the filters. In other embodiments, however, the pixel walls may include a greater or lesser amount or density of dye or pigment materials.

Referring to FIG. 8B, mask 806 is placed over photoresist material 804. Photoresist material 804 is then exposed to light through the gaps in mask 806 to pattern photoresist material 804. The portions of photoresist material 804 exposed to light through mask 806 cure or harden. Mask 806 and the non-cured portions of photoresist material 804 can then be removed to form a first set of pixel walls 808 as illustrated in FIG. 8C. Although the present example is described in terms of a negative photoresist material 804, it should be understood that in order fabrication processes positive-type photoresist materials could be used instead. In that case, the portion of the photoresist material exposed to light becomes soluble in the developer material and is removed during fabrication. The mask used for both types of materials may include different patterns.

Turning to FIG. 8D, photoresist material 810, such as epoxy-based negative photoresist SU-8, is deposited over multilayer stack 802 and around pixel walls 808. Photoresist material 810 is configured to be transparent to second wavelengths of electromagnetic radiation (e.g., red), while being absorbing to other wavelengths of electromagnetic radiation.

Turning to FIG. 8E, mask 812 is placed over photoresist material 810. Photoresist material 810 is then exposed to light through the gaps in mask 812 to pattern photoresist material 810. The portions of photoresist material 810 exposed to light through mask 812 cure or harden. Mask 812 and the non-cured portions of photoresist material 810 can then be removed to form a second set of pixel walls 814 as illustrated in FIG. 8F.

Figure 8G:
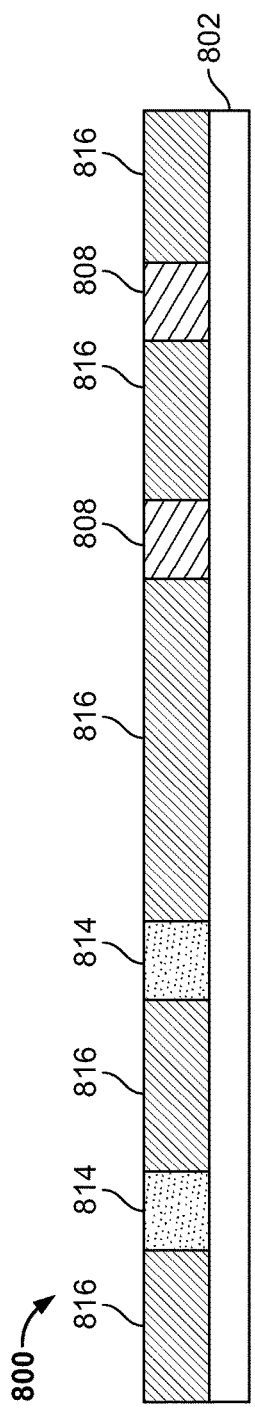

Turning to FIG. 8G, photoresist material 816, such as epoxy-based negative photoresist SU-8, is deposited over multilayer stack 802 and around pixel walls 808 and 814. Photoresist material 816 is configured to be transparent to third wavelengths of electromagnetic radiation (e.g., green), while absorbing other wavelengths of electromagnetic radiation.

Figure 8H:
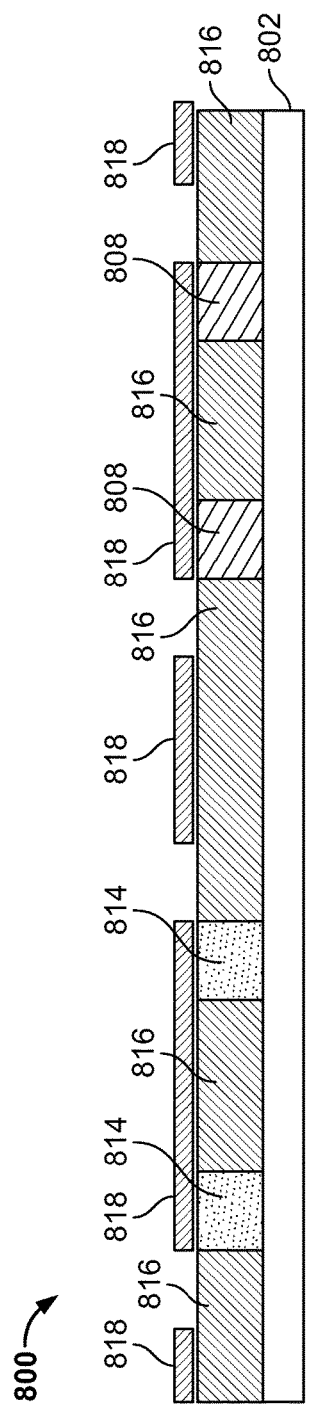
Figure 8I:
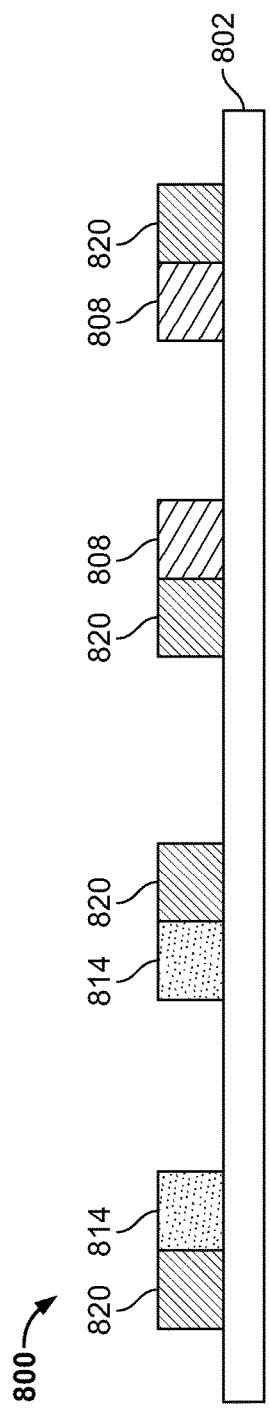

Turning to FIG. 8H, mask 818 is placed over photoresist material 816. Photoresist material 816 is then exposed to light through the gaps in mask 818 to pattern photoresist material 816. The portions of photoresist material 816 exposed to light through mask 818 cure or harden. Mask 818 and the non-cured portions of photoresist material 816 can then be removed to form a third set of pixel walls 820 as illustrated in FIG. 8I. As shown in FIG. 8I, pixel walls 808, 814, and 820 are formed so that portions of the pixel walls may be in contact with one another.

With the pixel walls formed as illustrated in FIGS. 8A-8I, the first and second fluid can be positioned over multilayer stack 802 and a second support plate can be mounted over the fluid and multilayer stack 802 parallel to multilayer stack 802.

In various manufacturing steps various combinations of pixel walls can be combined, wherein different portions of the pixel walls may be configured to be transparent to particular wavelengths of electromagnetic radiation while blocking other wavelengths of electromagnetic radiation. The various pixel wall configurations may include pixel walls or portions of pixel walls that are transparent to all wavelengths of electromagnetic radiation.

Figure 9:
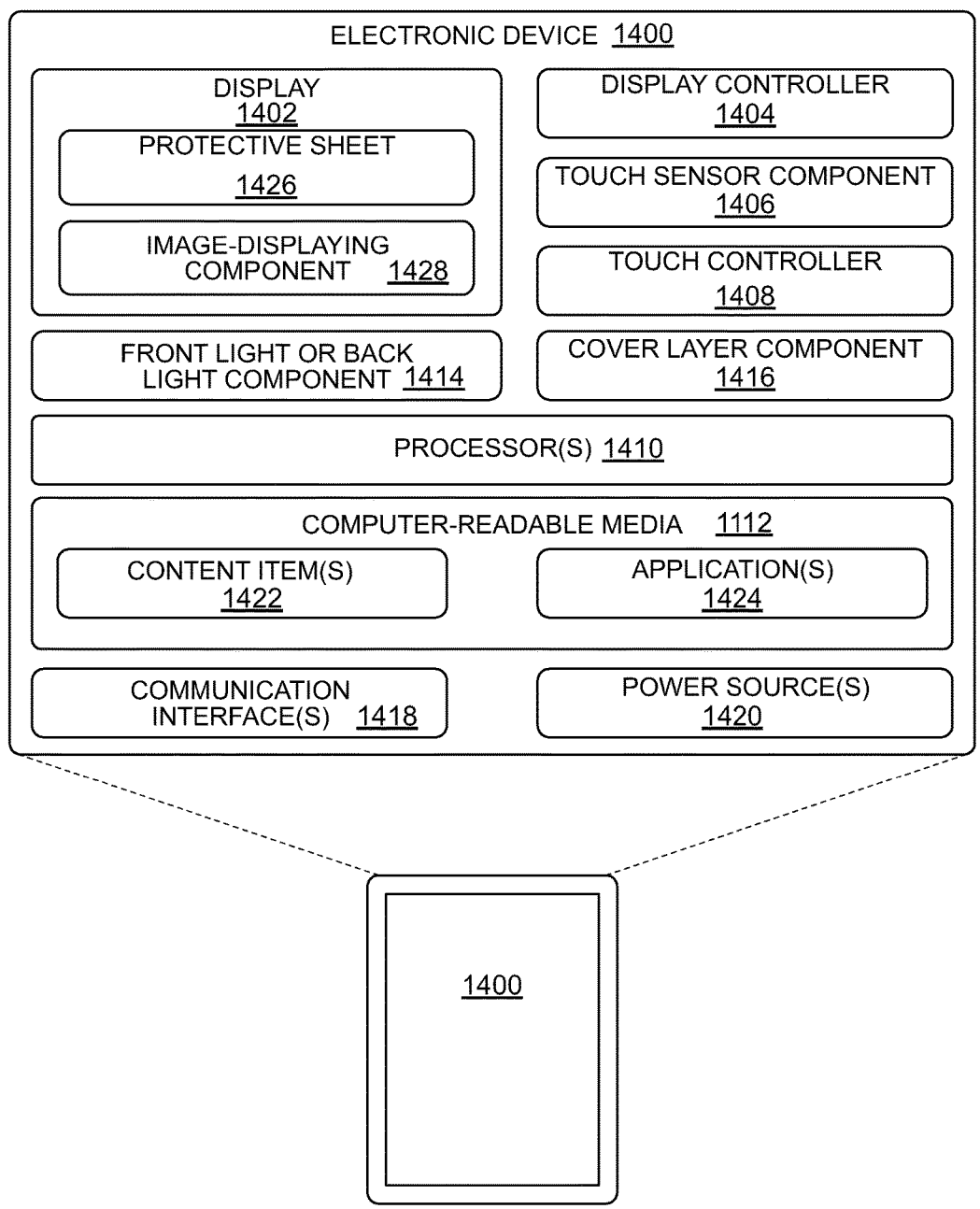
FIG. 9 illustrates an example electronic device that may incorporate a display device, according to various embodiments.

FIG. 9 illustrates an example electronic device 1400 that may incorporate any of the display devices discussed above. Electronic device 1400 may comprise any type of electronic device having a display. For instance, electronic device 1400 may be a mobile electronic device (e.g., an electronic book reader, a tablet computing device, a laptop computer, a smart phone or other multifunction communication device, a portable digital assistant, a wearable computing device, or an automotive display). Alternatively, electronic device 1400 may be a non-mobile electronic device (e.g., a computer display or a television). In addition, while FIG. 9 illustrates several example components of electronic device 1400, it is to be appreciated that electronic device 1400 may also include other conventional components, such as an operating system, system busses, input/output components, and the like. Further, in other embodiments, such as in the case of a television or computer monitor, electronic device 1400 may only include a subset of the components illustrated.

Regardless of the specific implementation of electronic device 1400, electronic device 1400 includes a display 1402 and a corresponding display controller 1404. The display 1402 may represent a reflective or transmissive display in some instances or, alternatively, a transflective display (partially transmissive and partially reflective).

In one embodiment, display 1402 comprises an electrowetting display that employs an applied voltage to change the surface tension of a fluid in relation to a surface. For example, such an electrowetting display may include the array of pixels 100 illustrated in FIG. 1, though claimed subject matter is not limited in this respect. By applying a voltage across a portion of an electrowetting pixel of an electrowetting display, wetting properties of a surface may be modified so that the surface becomes increasingly hydrophilic. As one example of an electrowetting display, the modification of the surface tension acts as an optical switch by displacing a colored oil film if a voltage is applied to individual pixels of the display. If the voltage is absent, the colored oil forms a continuous film within a pixel, and the color may thus be visible to a user. On the other hand, if the voltage is applied to the pixel, the colored oil is displaced and the pixel becomes transparent. If multiple pixels of the display are independently activated, display 1402 may present a color or grayscale image. The pixels may form the basis for a transmissive, reflective, or transmissive/reflective (transreflective) display. Further, the pixels may be responsive to high switching speeds (e.g., on the order of several milliseconds), while employing small pixel dimensions. Accordingly, the electrowetting displays herein may be suitable for applications such as displaying video or other animated content.

Of course, while several different examples have been given, it is to be appreciated that while some of the examples described above are discussed as rendering black, white, and varying shades of gray, it is to be appreciated that the described techniques apply equally to reflective displays capable of rendering color pixels. As such, the terms "white," "gray," and "black" may refer to varying degrees of color in implementations utilizing color displays. For instance, where a pixel includes a red color filter, a "gray" value of the pixel may correspond to a shade of pink while a "white" value of the pixel may correspond to a brightest red of the color filter. Furthermore, while some examples herein are described in the environment of a reflective display, in other examples, display 1402 may represent a backlit display, examples of which are mentioned above.

In addition to including display 1402, FIG. 9 illustrates that some examples of electronic device 1400 may include a touch sensor component 1406 and a touch controller 1408. In some instances, at least one touch sensor component 1406 resides with, or is stacked on, display 1402 to form a touch-sensitive display. Thus, display 1402 may be capable of both accepting user touch input and rendering content in response to or corresponding to the touch input. As several examples, touch sensor component 1406 may comprise a capacitive touch sensor, a force sensitive resistance (FSR), an interpolating force sensitive resistance (IFSR) sensor, or any other type of touch sensor. In some instances, touch sensor component 1406 is capable of detecting touches as well as determining an amount of pressure or force of these touches.

FIG. 9 further illustrates that electronic device 1400 may include one or more processors 1410 and one or more computer-readable media 1412, as well as a front light component 1414 (which may alternatively be a backlight component in the case of a backlit display) for lighting display 1402, a cover layer component 1416, such as a cover glass or cover sheet, one or more communication interfaces 1418 and one or more power sources 1420. The communication interfaces 1418 may support both wired and wireless connection to various networks, such as cellular networks, radio, WiFi networks, short range networks (e.g., Bluetooth® technology), and infrared (IR) networks, for example.

Depending on the configuration of electronic device 1400, computer-readable media 1412 (and other computer-readable media described throughout) is an example of computer storage media and may include volatile and nonvolatile memory. Thus, computer-readable media 1412 may include, without limitation, RAM, ROM, EEPROM, flash memory, and/or other memory technology, and/or any other suitable medium that may be used to store computer-readable instructions, programs, applications, media items, and/or data which may be accessed by electronic device 1400.

Computer-readable media 1412 may be used to store any number of functional components that are executable on processor 1410, as well as content items 1422 and applications 1424. Thus, computer-readable media 1412 may include an operating system and a storage database to store one or more content items 1422, such as eBooks, audio books, songs, videos, still images, and the like. Computer-readable media 1412 of electronic device 1400 may also store one or more content presentation applications to render content items on electronic device 1400. These content presentation applications may be implemented as various applications 1424 depending upon content items 1422. For instance, the content presentation application may be an electronic book reader application for rending textual electronic books, an audio player for playing audio books or songs, or a video player for playing video.

In some instances, electronic device 1400 may couple to a cover (not illustrated in FIG. 9) to protect the display 1402 (and other components in the display stack or display assembly) of electronic device 1400. In one example, the cover may include a back flap that covers a back portion of electronic device 1400 and a front flap that covers display 1402 and the other components in the stack. Electronic device 1400 and/or the cover may include a sensor (e.g., a Hall effect sensor) to detect whether the cover is open (i.e., if the front flap is not atop display 1402 and other components). The sensor may send a signal to front light component 1414 if the cover is open and, in response, front light component 1414 may illuminate display 1402. If the cover is closed, meanwhile, front light component 1414 may receive a signal indicating that the cover has closed and, in response, front light component 1414 may turn off.

Furthermore, the amount of light emitted by front light component 1414 may vary. For instance, upon a user opening the cover, the light from the front light may gradually increase to its full illumination. In some instances, electronic device 1400 includes an ambient light sensor (not illustrated in FIG. 9) and the amount of illumination of front light component 1414 may be based at least in part on the amount of ambient light detected by the ambient light sensor. For example, front light component 1414 may be dimmer if the ambient light sensor detects relatively little ambient light, such as in a dark room; may be brighter if the ambient light sensor detects ambient light within a particular range; and may be dimmer or turned off if the ambient light sensor detects a relatively large amount of ambient light, such as direct sunlight.

In addition, the settings of display 1402 may vary depending on whether front light component 1414 is on or off, or based on the amount of light provided by front light component 1414. For instance, electronic device 1400 may implement a larger default font or a greater contrast when the light is off compared to when the light is on. In some embodiments, electronic device 1400 maintains, if the light is on, a contrast ratio for display 1402 that is within a certain defined percentage of the contrast ratio if the light is off.

As described above, touch sensor component 1406 may comprise a capacitive touch sensor that resides atop display 1402. In some examples, touch sensor component 1406 may be formed on or integrated with cover layer component 1416. In other examples, touch sensor component 1406 may be a separate component in the stack of the display assembly. Front light component 1414 may reside atop or below touch sensor component 1406. In some instances, either touch sensor component 1406 or front light component 1414 is coupled to a top surface of a protective sheet 1426 of display 1402. As one example, front light component 1414 may include a lightguide sheet and a light source (not illustrated in FIG. 9). The lightguide sheet may comprise a substrate (e.g., a transparent thermoplastic such as PMMA or other acrylic), a layer of lacquer and multiple grating elements formed in the layer of lacquer that function to propagate light from the light source towards display 1402; thus, illuminating display 1402.

Cover layer component 1416 may include a transparent substrate or sheet having an outer layer that functions to reduce at least one of glare or reflection of ambient light incident on electronic device 1400. In some instances, cover layer component 1416 may comprise a hard-coated polyester and/or polycarbonate film, including a base polyester or a polycarbonate, that results in a chemically bonded UV-cured hard surface coating that is scratch resistant. In some instances, the film may be manufactured with additives such that the resulting film includes a hardness rating that is greater than a predefined threshold (e.g., at least a hardness rating that is resistant to a 3h pencil). Without such scratch resistance, a device may be more easily scratched and a user may perceive the scratches from the light that is dispersed over the top of the reflective display. In some examples, protective sheet 1426 may include a similar UV-cured hard coating on the outer surface. Cover layer component 1416 may couple to another component or to protective sheet 1426 of display 1402. Cover layer component 1416 may, in some instances, also include a UV filter, a UV-absorbing dye, or the like, for protecting components lower in the stack from UV light incident on electronic device 1400. In still other examples, cover layer component 1416 may include a sheet of high-strength glass having an antiglare and/or antireflective coating.

Display 1402 includes protective sheet 1426 overlying an image-displaying component 1428. For example, display 1402 may be preassembled to have protective sheet 1426 as an outer surface on the upper or image-viewing side of display 1402. Accordingly, protective sheet 1426 may be integral with and may overlay image-displaying component 1428. Protective sheet 1426 may be optically transparent to enable a user to view, through protective sheet 1426, an image presented on image-displaying component 1428 of display 1402.

In some examples, protective sheet 1426 may be a transparent polymer film in the range of 25 to 200 micrometers in thickness. As several examples, protective sheet 1426 may be a transparent polyester, such as polyethylene terephthalate (PET) or polyethylene naphthalate (PEN), or other suitable transparent polymer film or sheet, such as a polycarbonate or an acrylic. In some examples, the outer surface of protective sheet 1426 may include a coating, such as the hard coating described above. For instance, the hard coating may be applied to the outer surface of protective sheet 1426 before or after assembly of protective sheet 1426 with image-displaying component 1428 of display 1402. In some examples, the hard coating may include a photoinitiator or other reactive species in its composition, such as for curing the hard coating on protective sheet 1426. Furthermore, in some examples, protective sheet 1426 may be dyed with a UV-light-absorbing dye, or may be treated with other UV-absorbing treatment. For example, protective sheet 1426 may be treated to have a specified UV cutoff such that UV light below a cutoff or threshold wavelength is at least partially absorbed by protective sheet 1426, thereby protecting image-displaying component 1428 from UV light.

According to some embodiments herein, one or more of the components discussed above may be coupled to display 1402 using fluid optically-clear adhesive (LOCA). For example, the lightguide portion of front light component 1414 may be coupled to display 1402 by placing LOCA on the outer or upper surface of protective sheet 1426. If the LOCA reaches the corner(s) and/or at least a portion of the perimeter of protective sheet 1426, UV-curing may be performed on the LOCA at the corners and/or the portion of the perimeter. Thereafter, the remaining LOCA may be UV-cured and front light component 1414 may be coupled to the LOCA. By first curing the corner(s) and/or the perimeter, the techniques effectively create a barrier for the remaining LOCA and also prevent the formation of air gaps in the LOCA layer, thereby increasing the efficacy of front light component 1414. In other embodiments, the LOCA may be placed near a center of protective sheet 1426, and pressed outwards towards a perimeter of the top surface of protective sheet 1426 by placing front light component 1414 on top of the LOCA. The LOCA may then be cured by directing UV light through front light component 1414. As discussed above, and as discussed additionally below, various techniques, such as surface treatment of the protective sheet, may be used to prevent discoloration of the LOCA and/or protective sheet 1426.

While FIG. 9 illustrates a few example components, electronic device 1400 may have additional features or functionality. For example, electronic device 1400 may also include additional data storage devices (removable and/or non-removable) such as, for example, magnetic disks, optical disks, or tape. The additional data storage media, which may reside in a control board, may include volatile and nonvolatile, removable and non-removable media implemented in any method or technology for storage of information, such as computer readable instructions, data structures, program modules, or other data. In addition, some or all of the functionality described as residing within electronic device 1400 may reside remotely from electronic device 1400 in some implementations. In these implementations, electronic device 1400 may utilize communication interfaces 1418 to communicate with and utilize this functionality.

In an embodiment, an electrowetting display device includes a first support plate and a second support plate. The electrowetting display device includes a first fluid and a second fluid that is immiscible with the first fluid. The first fluid and the second fluid are between the first support plate and the second support plate. The electrowetting display device includes a plurality of pixel walls over the first support plate. The plurality of pixel walls are associated with an electrowetting pixel and allow propagation of visible light of a first color and prevent propagation of visible light of a second color. The second color is different from the first color. The electrowetting display device includes a color filter over the electrowetting pixel. The color filter allows propagation of visible light of the first color and prevents propagation of visible light of the second color. The electrowetting display device includes a pixel electrode over the first support plate and a common electrode coupled to the second fluid for applying a voltage within the electrowetting pixel to cause relative displacement of the first fluid and the second fluid.

In another embodiment, a display device includes a first support plate, and a wall over the first support plate. The wall is associated with an electrowetting pixel. The wall allows propagation of light having a wavelength within a first range of wavelengths and prevents propagation of light having a second wavelength in a second range of wavelengths. The display device includes a color filter over the electrowetting pixel. The color filter allows propagation of light having the wavelength within the first range of wavelengths and prevents propagation of light having the second wavelength within the second range of wavelengths.

In another embodiment, a method for fabricating at least a portion of an electrowetting display device includes depositing a first photoresist over a surface of a support plate. The first photoresist is transparent to a first color of visible light and absorbing a second color of visible light. The method includes patterning the first photoresist through a first mask to cure a first portion of the first photoresist into a first pixel wall that is transparent to the first color of visible light and absorbing the second color of visible light, and depositing a second photoresist over the surface of the support plate. The second photoresist being transparent to the second color of visible light and absorbing the first color of visible light. The method includes patterning the second photoresist through a second mask to cure a second portion of the second photoresist into a second pixel wall that is transparent to the second color of visible light and absorbing the first color of visible light.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification is not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

What is claimed is:

1. An electrowetting display device, comprising:
   a first support plate and a second support plate;
   a first fluid and a second fluid that is immiscible with the first fluid, the first fluid and the second fluid between the first support plate and the second support plate;
   a plurality of pixel walls over the first support plate, a pixel wall of the plurality of pixel walls comprising:
      a first region associated with a first electrowetting pixel, the first region allowing propagation of visible light of a first color and preventing propagation of visible light of a second color, the second color different from the first color, the first region in contact with first fluid of the first electrowetting pixel to at least partly retain first fluid to the first electrowetting pixel; and
      a second region associated with a second electrowetting pixel, the second region allowing propagation of visible light of the second color and preventing propagation of visible light of the first color, the second region in contact with first fluid of the second electrowetting pixel to at least partly retain first fluid to the second electrowetting pixel;
   a color filter over the first electrowetting pixel, the color filter allowing propagation of visible light of the first color and preventing propagation of visible light of the second color; and
   a pixel electrode over the first support plate and a common electrode coupled to the second fluid for applying a voltage within the first electrowetting pixel to cause relative displacement of the first fluid and the second fluid.

2. The electrowetting display device of claim 1, wherein the first electrowetting pixel is adjacent to the second electrowetting pixel in the electrowetting display device and the first region is along a boundary between the first electrowetting pixel and the second electrowetting pixel and the second region is along the boundary between the first electrowetting pixel and the second electrowetting pixel.

3. A display device, comprising:
   a first support plate;
   a wall over the first support plate, the wall comprising:
      a first region associated with a first electrowetting pixel, wherein the first region allows propagation of light having a first wavelength within a first range of wavelengths and prevents propagation of light having a second wavelength in a second range of wavelengths, the first region in contact with a first fluid of the first electrowetting pixel to at least partly retain the first fluid of the first electrowetting pixel to the first electrowetting pixel and a second region associated with a second electrowetting pixel, wherein the second region allows propagation of light having the second wavelength within the second range of wavelengths and prevents propagation of light having the first wavelength within the first range of wavelengths, the second region in contact with a first fluid of the second electrowetting pixel to at least partly retain the first fluid of the second electrowetting pixel to the second electrowetting pixel; and a color filter over the first electrowetting pixel, the color filter configured to allow propagation of light having the first wavelength within the first range of wavelengths and to prevent propagation of light having the second wavelength within the second range of wavelength.

4. The display device of claim 3, wherein at least a portion of the color filter is located directly over a portion of the wall.

5. The display device of claim 3, wherein the first range of wavelengths is different from the second range of wavelengths.

6. The display device of claim 3, wherein the first range of wavelengths comprises wavelengths between at least one of 435 nanometers to 500 nanometers, 520 nanometers to 565 nanometers, and 625 nanometers to 740 nanometers.

7. The display device of claim 3, wherein the first electrowetting pixel is adjacent to the second electrowetting pixel in the display device and the first region is along a boundary between the first electrowetting pixel and the second electrowetting pixel and the second region is along the boundary between the first electrowetting pixel and the second electrowetting pixel.

8. The display device of claim 3, wherein the color filter is a first color filter, and the second electrowetting pixel comprises a second color filter over the second electrowetting pixel, the second color filter configured to allow propagation of light having the second wavelength within the second range of wavelengths and to prevent propagation of light having the first wavelength within the first range of wavelengths.

9. The display device of claim 3, wherein the wall is a first wall, and further comprising a second wall over the first support plate, the second wall associated with a third electrowetting pixel, the second wall transparent to substantially all visible light.

10. The display device of claim 3, wherein the first region allows propagation of at least 70% of light within the first range of wavelengths and prevents propagation of at least 70% of light in the second range of wavelengths.

11. The display device of claim 10, wherein the first electrowetting pixel comprises a pixel electrode over the first support plate, and a common electrode coupled to a second fluid for applying a voltage within the first electrowetting pixel to cause relative displacement of the first fluid and the second fluid within the first electrowetting pixel.

12. The display device of claim 3, wherein, with no intervening electrowetting pixel between the first electrowetting pixel and the second electrowetting pixel, each of the first region and the second region is between the first fluid of the first electrowetting pixel and the first fluid of the second electrowetting pixel.

13. The display device of claim 3, wherein the first region contacts the second region.

14. A method for fabricating at least a portion of an electrowetting display device, the method comprising:
depositing a first photoresist over a surface of a support plate, the first photoresist transparent to a first color of visible light and absorbing a second color of visible light;
patterning the first photoresist through a first mask to cure a first portion of the first photoresist into a first region of a pixel wall that is transparent to the first color of visible light and absorbing the second color of visible light;
depositing a second photoresist over the surface of the support plate, the second photoresist transparent to the second color of visible light and absorbing the first color of visible light;
patterning the second photoresist through a second mask to cure a second portion of the second photoresist into a second region of the pixel wall that is transparent to the second color of visible light and absorbing the first color of visible light;
providing a first fluid for a first electrowetting pixel in contact with the first region of the pixel wall, so that the first fluid for the first electrowetting pixel is at least partly retained by the first region; and
providing a first fluid for a second electrowetting pixel in contact with the second region of the pixel wall, so that the first fluid for the second electrowetting pixel is at least partly retained by the second region.

15. The method of claim 14, wherein the first region is associated with the first electrowetting pixel, the method further comprising forming a first color filter over the first electrowetting pixel, the first color filter transparent to the first color of visible light and absorbing the second color of visible light.

16. The method of claim 15, wherein the second region is associated with the second electrowetting pixel, the method further comprising forming a second color filter over the second electrowetting pixel, the second color filter transparent to the second color of visible light and absorbing the first color of visible light.

17. The method of claim 16, wherein the first electrowetting pixel is adjacent to the second electrowetting pixel in the electrowetting display device and the first region is in contact with the second region.

18. The method of claim 14, further comprising positioning a second fluid over the support plate and mounting a second support plate parallel to the support plate and over the second fluid.

19. The method of claim 14, wherein the pixel wall is a first pixel wall, the method further comprising:
depositing a third photoresist over the surface of the support plate, the third photoresist transparent to substantially all visible light; and
patterning the third photoresist through a third mask to cure a third portion of the third photoresist into a second pixel wall that is transparent to substantially all visible light.

20. The method of claim 14, wherein after providing the first fluid for the first electrowetting pixel and providing the first fluid for the second electrowetting pixel, and with no intervening electrowetting pixel between the first electrowetting pixel and the second electrowetting pixel, each of the first region and the second region is between the first fluid of the first electrowetting pixel and the first fluid of the second electrowetting pixel.

* * * * *